US010916435B2

(12) United States Patent
Ishida

(10) Patent No.: US 10,916,435 B2
(45) Date of Patent: Feb. 9, 2021

(54) SURFACE TREATMENT COMPOSITION, METHOD OF PRODUCING SURFACE TREATMENT COMPOSITION, METHOD OF TREATING SURFACE, AND METHOD OF PRODUCING SEMICONDUCTOR SUBSTRATE

(71) Applicant: FUJIMI INCORPORATED, Aichi (JP)

(72) Inventor: Yasuto Ishida, Aichi (JP)

(73) Assignee: FUJIMI INCORPORATED

( * ) Notice: Subject to any disclaimer, the term of this patent is extended or adjusted under 35 U.S.C. 154(b) by 219 days.

(21) Appl. No.: 16/084,196

(22) PCT Filed: Mar. 6, 2017

(86) PCT No.: PCT/JP2017/008837

§ 371 (c)(1),
(2) Date: Sep. 11, 2018

(87) PCT Pub. No.: WO2017/169539

PCT Pub. Date: Oct. 5, 2017

(65) Prior Publication Data

US 2020/0294808 A1 Sep. 17, 2020

(30) Foreign Application Priority Data

Mar. 30, 2016 (JP) ................................ 2016-067151

(51) Int. Cl.

| | |
|---|---|
| ***H01L 21/304*** | (2006.01) |
| ***C09G 1/02*** | (2006.01) |
| ***C11D 1/04*** | (2006.01) |
| ***C11D 1/12*** | (2006.01) |
| ***C11D 7/34*** | (2006.01) |
| ***C11D 11/00*** | (2006.01) |
| ***H01L 21/02*** | (2006.01) |

(52) U.S. Cl.

CPC .............. *H01L 21/304* (2013.01); *C11D 1/04* (2013.01); *C11D 1/12* (2013.01); *C11D 7/34* (2013.01); *C11D 11/0047* (2013.01); *H01L 21/02052* (2013.01)

(58) Field of Classification Search

None

See application file for complete search history.

(56) References Cited

U.S. PATENT DOCUMENTS

| | | | | |
|---|---|---|---|---|
| 2010/0016202 | A1 | 1/2010 | Mui et al. | |
| 2015/0123027 | A1* | 5/2015 | Sakaida | H01L 21/30625 252/79.1 |
| 2015/0316867 | A1 | 11/2015 | Shoji et al. | |
| 2019/0177671 | A1* | 6/2019 | Parson | C11D 3/2096 |
| 2020/0048584 | A1* | 2/2020 | Takahashi | C11D 11/0047 |

FOREIGN PATENT DOCUMENTS

| | | | |
|---|---|---|---|
| JP | 2001064685 | A | 3/2001 |
| JP | 2010-163608 | A | 12/2009 |
| JP | 2012-074678 | A | 12/2012 |
| JP | 2012-533649 | A | 12/2012 |
| JP | 2013094906 | A | 5/2013 |
| WO | 2011/008658 | A1 | 1/2011 |

OTHER PUBLICATIONS

International Search Report for International Application No. PCT/JP2017/008837 dated May 26, 2017.

Office Action for TW Application No. 106108760, dated May 27, 2020.

Official Notice of Reason for Refusal for JP Application No. 2018-508867 dated Apr. 22, 2020.

Notice of Reason for Refusal for JP Patent Appl. No. 2018-508867, dated Nov. 10, 2020.

* cited by examiner

*Primary Examiner* — Asok K Sarkar

(74) *Attorney, Agent, or Firm* — Katten Munchin Rosenman LLP

(57) ABSTRACT

The present invention provides a means for sufficiently removing organic residues remaining on the surface of an object to be polished which contains silicon nitride, silicon oxide, or polysilicon and has been polished. The present invention relates to a surface treatment composition including a polymer compound having a sulfonic acid (salt) group and water, wherein the surface treatment composition has a pH value of less than 7 and the surface treatment composition is used for decreasing an organic residue on a surface of an object to be polished which contains silicon nitride, silicon oxide, or polysilicon and has been polished.

20 Claims, No Drawings

SURFACE TREATMENT COMPOSITION, METHOD OF PRODUCING SURFACE TREATMENT COMPOSITION, METHOD OF TREATING SURFACE, AND METHOD OF PRODUCING SEMICONDUCTOR SUBSTRATE

TECHNICAL FIELD

The present invention relates to a surface treatment composition, a method of producing a surface treatment composition, a method of treating a surface, and a method of producing a semiconductor substrate.

BACKGROUND ART

In recent years, the so-called chemical mechanical polishing (CMP) technique for physically polishing and flattening a semiconductor substrate is utilized when producing a device along with adoption of multilayer wiring on the surface of a semiconductor substrate. CMP is a method for flattening the surface of an object to be polished (material to be polished) such as a semiconductor substrate by using a composition (slurry) for polishing which contains abrasive grains such as silica, alumina, and ceria, an anticorrosive, a surfactant, and the like, and the object to be polished (material to be polished) is silicon, polysilicon, silicon oxide, silicon nitride, a wire and a plug made of a metal, and the like.

A large amount of impurities (defects) remain on the surface of a semiconductor substrate after being subjected to the CMP step. Examples of the impurities may include abrasive grains derived from the composition for polishing used in CMP, a metal, an anticorrosive, organic substances such as a surfactant, a silicon-containing material which is an object to be polished, a silicon-containing material and a metal generated by polishing of a metal wire, a plug, and the like, and further, organic substances such as pad scraps generated from various kinds of pads and the like.

Contamination of the surface of a semiconductor substrate with these impurities adversely affects the electrical properties of a semiconductor and possibly decreases the reliability of a device. Hence, it is desirable to introduce a surface treatment step after the CMP step and thus to remove these impurities from the surface of a semiconductor substrate.

As such a composition for cleaning, JP 2012-74678 A (corresponding to US: US 2013/174867 A) discloses that defects can be removed without corroding the surface of a substrate by using a composition for cleaning of a semiconductor substrate, which contains a polycarboxylic acid or a hydroxycarboxylic acid, a sulfonic acid type anionic surfactant, a carboxylic acid type anionic surfactant, and water.

SUMMARY OF INVENTION

However, the technique according to JP 2012-74678 A has a problem that defects cannot be sufficiently removed when cleaning an object to be polished which has been polished.

Here, the inventors of the present invention have investigated the relationship between the kind of object to be polished which has been polished and the kind of defects. As a result, it has been found out that organic residues are likely to adhere to an object to be polished which contains silicon nitride, silicon oxide, or polysilicon and has been polished, particularly preferably used as a semiconductor substrate, and such organic residues can cause destruction of the semiconductor device.

The present invention has been made in view of the above problems, and an object thereof is to provide a means for sufficiently removing organic residues remaining on the surface of an object to be polished which contains silicon nitride, silicon oxide, or polysilicon and has been polished.

In view of the above problem, the inventors of the present invention have carried out intensive investigations. As a result, it has been found out that an effect of removing organic residues on the surface of silicon nitride, silicon oxide, or polysilicon is remarkably improved as a surface treatment composition contains a polymer compound having a sulfonic acid (salt) group under an acidic condition, whereby the present invention has been completed.

In other words, the above problem of the present invention is solved by the following means.

1. A surface treatment composition including a polymer compound having a sulfonic acid (salt) group and water, wherein the surface treatment composition has a pH value of less than 7 and the surface treatment composition is used for decreasing an organic residue on a surface of an object to be polished which contains silicon nitride, silicon oxide, or polysilicon and has been polished.

2. The surface treatment composition according to the above item 1, wherein the surface treatment composition has a pH value of 1 or more and less than 3.

3. The surface treatment composition according to the above item 1 or 2, further including an acid.

4. The surface treatment composition according to any one of the above items 1 to 3, wherein a content of the polymer compound having a sulfonic acid (salt) group is more than 80% by mass with respect to a total mass of polymer compounds contained in the surface treatment composition.

5. The surface treatment composition according to the above item 4, wherein a content of the polymer compound having a sulfonic acid (salt) group is more than 95% by mass with respect to a total mass of polymer compounds contained in the surface treatment composition.

6. The surface treatment composition according to any one of the above items 1 to 5, wherein the object to be polished which has been polished is an object to be polished which contains silicon nitride and has been polished.

7. A method of treating a surface, the method including treating a surface of an object to be polished which has been polished using the surface treatment composition according to any one of the above items 1 to 6 to decrease an organic residue on the surface of the object to be polished which has been polished.

8. The method of treating a surface according to the above item 7, wherein the surface treatment is conducted by a rinse polishing treatment or a cleaning treatment.

9. A method of producing the surface treatment composition according to any one of the above items 1 to 6, the method including mixing the polymer compound having a sulfonic acid (salt) group and the water.

10. A method of producing a semiconductor substrate, the method including a surface treatment step of decreasing an organic residue on a surface of a polished semiconductor substrate by the method of treating a surface according to the above item 7 or 8, wherein an object to be polished which has been polished is a polished semiconductor substrate.

DESCRIPTION OF EMBODIMENTS

Hereinafter, the present invention will be described. It should be noted that the present invention is not limited only to the following embodiments. In the present specification, the expression "X to Y" indicating the range means "X or more and Y or less". In addition, in the present specification, the operation and measurement of physical properties are conducted under the condition of room temperature (20° C. to 25° C.)/relative humidity of 40% to 50% RH unless otherwise stated.

Incidentally, in the present specification, the notation "(meth)acryl" in the specific name of a compound represents "acrylic" and "methacrylic" and the notation "(meth)acrylate" represents an "acrylate" and a "methacrylate".

<Organic Residue>

In the present specification, the organic residues represent components composed of an organic substance such as an organic low molecular weight compound or a polymer compound, an organic salt, and the like among defects adhered to the surface of an object to be surface treated.

Examples of the organic residues adhering to the object to be surface treated may include pad scraps generated from a pad used in a polishing step to be described later or another rinse polishing step which may be arbitrarily provided and will be described later or a component derived from an additive to be contained in a composition for polishing to be used in a polishing step or a composition for rinse polishing to be used in another rinse polishing step to be described later.

Incidentally, the organic residues and other defects are largely different in color and shape, and whether a defect is an organic residue or not can be thus visually judged through SEM observation. Incidentally, whether the defect is an organic residue or not may be judged through elemental analysis using an energy dispersive X-ray analyzer (EDX) if necessary.

<Object to be Polished which has been Polished>

In the present specification, the object to be polished which has been polished means an object to be polished after being polished in a polishing step. The polishing step is not particularly limited, but it is preferably a CMP step.

It is particularly preferable that the surface treatment composition according to an embodiment of the present invention is used for decreasing the organic residues remaining on the surface of an object to be polished which contains silicon nitride, silicon oxide, or polysilicon and has been polished (the object to be polished which has been polished is also referred to as an "object to be surface treated" in the present specification). In the present specification, an object to be polished which contains silicon nitride, silicon oxide, or polysilicon and has been polished represents an object to be polished which contains silicon nitride, silicon oxide, or polysilicon on the surface of an object to be subjected to a surface treatment and has been polished.

Examples of the an object to be polished which contains silicon oxide and has been polished may include a surface of TEOS type silicon oxide to be generated using tetraethyl orthosilicate as a precursor (hereinafter also simply referred to as "TEOS" or "TEOS film"), a HDP film, a USG film, a PSG film, a BPSG film, and an RTO film.

The object to be polished which has been polished is preferably a polished semiconductor substrate and more preferably a semiconductor substrate after being subjected to CMP. The reason for this is because the surface treatment step of a semiconductor substrate is required to be a step which can remove the organic residues as much as possible in a case in which the object to be polished which has been polished is a polished semiconductor substrate since organic residues particularly can cause destruction of the semiconductor device.

The object to be polished which contains silicon nitride, silicon oxide, or polysilicon and has been polished is not particularly limited, but examples thereof may include objects to be polished which contain each of silicon nitride, silicon oxide, or polysilicon singly and has been polished and an object to be polished which has been polished and is in a state in which silicon nitride, silicon oxide, or polysilicon and a material other than these are exposed on the surface. Here, examples of the former may include a silicon nitride substrate, a silicon oxide substrate, or a polysilicon substrate, which is a conductor substrate. In addition, with regard to the latter, the material exposed on the surface other than silicon nitride, silicon oxide, or polysilicon is not particularly limited, but examples thereof may include tungsten. Specific examples of such an object to be polished which has been polished may include a polished semiconductor substrate having a structure in which a silicon nitride film or a silicon oxide film is formed on tungsten and a tungsten portion and a silicon nitride film or a silicon oxide film are exposed and a polished semiconductor substrate having a structure in which the tungsten portion, the silicon nitride film, and the silicon oxide film are all exposed, but it is not limited thereto.

Here, from the viewpoint of the effect exhibited by the present invention, the surface treatment composition according to an embodiment of the present invention is preferably used for decreasing the organic residues on the surface of an object to be polished which contains silicon nitride or silicon oxide and has been polished and is more preferably used for decreasing the organic residues on the surface of an object to be polished which contains silicon nitride and has been polished. The reason for this is because the effect of removing the organic residues on an object to be polished which contains silicon nitride or silicon oxide and has been polished is stronger than the effect of removing the organic residues on an object to be polished which contains polysilicon and has been polished. Furthermore, the reason for this is because it is presumed that silicon nitride is more strongly positively charged than silicon oxide under an acidic condition to be described later and the action of removing the organic residues on an object to be polished which contains silicon nitride and has been polished by a polymer compound having a sulfonic acid (salt) group is stronger.

<Surface Treatment Composition>

An embodiment of the present invention is a surface treatment composition which contains a polymer compound having a sulfonic acid (salt) group (a sulfonic acid group-containing polymer) and water, has a pH value of less than 7, and is used for decreasing the organic residues on the surface of an object to be polished which contains silicon nitride, silicon oxide, or polysilicon and has been polished. According to the surface treatment composition of the present embodiment, it is possible to provide a means capable of sufficiently removing organic residues remaining on the surface of an object to be polished which contains silicon nitride, silicon oxide, or polysilicon and has been polished.

It is particularly preferable that the surface treatment composition according to an embodiment of the present invention is used as an organic residue decreasing agent for selectively removing organic residues in the surface treatment step.

The mechanism through which the above problem is solved by the present invention is presumed as follows by the inventors of the present invention.

The respective components to be contained in the surface treatment composition interact with the surface of an object to be surface treated and defects, and the surface treatment composition has a function of removing defects on the surface of the object to be surface treated or facilitating removal thereof as a result of chemical interaction.

Here, as the organic residues to adhere to an object to be surface treated, there are a component (hereinafter also referred to as a "positively chargeable component") which is likely to be positively charged under an acidic condition and a hydrophobic component (hereinafter also referred to as a "hydrophobic component") which is hardly positively charged under an acidic condition, and it is required to remove these through separate mechanisms.

(When Object to be Surface Treated Contains Silicon Nitride or Silicon Oxide)

The mechanism for removal of organic residues by a surface treatment is presumed as follows.

The silicon nitride portion or the silicon oxide portion on the surface of an object to be surface treated is positively charged under an acidic condition. As a result, the sulfonic acid group-containing polymer electrostatically adsorbs to the object to be surface treated as the anionized sulfonic acid group of a part of the sulfonic acid group-containing polymer is directed to the surface side of the object to be surface treated and the anionized sulfonic acid group other than the anionized sulfonic acid group of the part is directed to the side (the side on which water is) opposite to the surface side of the object to be surface treated.

In addition, positively chargeable components among the organic residues are generally positively charged under an acidic condition. As a result, the sulfonic acid group-containing polymer electrostatically adsorbs to the surface of the positively chargeable components as the anionized sulfonic acid group of a part of the sulfonic acid group-containing polymer is directed to the positively chargeable component side and the anionized sulfonic acid group other than the anionized sulfonic acid group of the part is directed to the side (the side on which water is) opposite to the surface side of the positively chargeable components.

At this time, the object to be surface treated is in a state of being negatively charged as a state of being covered with the anionized sulfonic acid group directed to the side (the side on which water is) opposite to the surface side of the object to be surface treated and the positively chargeable component is in a state of being negatively charged as a state of being covered with the anionized sulfonic acid group directed to the side (the side on which water is) opposite to the surface side of the positively chargeable component. Moreover, the positively chargeable component is removed from the surface of the object to be surface treated as the object to be surface treated which is covered with the anionized sulfonic acid group and the positively chargeable component which is covered with the anionized sulfonic acid group electrostatically repel each other.

Meanwhile, the hydrophobic component adsorbs to the surface of the hydrophobic component by hydrophobic interaction as the hydrophobic structural moiety of the sulfonic acid group-containing polymer is directed to the surface side of the hydrophobic component and the anionized sulfonic acid group which is a hydrophilic structural moiety is directed to the side (the side on which water is) opposite to the surface side of the hydrophobic component.

At this time, the hydrophobic component and the sulfonic acid group-containing polymer form a micelle which is covered with the anionized sulfonic acid group directed to the side (the side on which water is) opposite to the surface side of the hydrophobic component. Moreover, the hydrophobic component is removed from the surface of the object to be surface treated as this micelle is dissolved or dispersed in the surface treatment composition.

Moreover, the sulfonic acid group-containing polymer adsorbed on the surface of the object to be surface treated is easily removed after the surface treatment step since it exhibits favorable removability.

(When Object to be Surface Treated Contains Polysilicon)

The mechanism for removal of organic residues by a surface treatment is presumed as follows.

The organic residues are removed by a mechanism different from that in the case in which the object to be surface treated contains silicon nitride or silicon oxide since the polysilicon portion on the surface of the object to be surface treated is not positively charged under an acidic condition. Polysilicon is hydrophobic and a hydrophobic component is in a state of being likely to adhere to the surface of the object to be surface treated by hydrophobic interaction, and thus the hydrophobic component which has been once removed from the surface of the object to be surface treated re-adheres to the surface in the surface treatment step.

Here, the hydrophobic structural moiety of the sulfonic acid group-containing polymer adsorbs to the surface of the object to be surface treated by hydrophobic interaction as the hydrophobic structural moiety of the sulfonic acid group-containing polymer is directed to the surface side of the object to be surface treated and the anionized sulfonic acid group or the like which is a hydrophilic structural moiety is directed to the side (the side on which water is) opposite to the surface side of the object to be surface treated.

As a result, the object to be surface treated becomes hydrophilic as a state of being covered with the anionized sulfonic acid group directed to the side (the side on which water is) opposite to the surface side of the object to be surface treated and hydrophobic interaction does not occur between the surface of the object to be surface treated which is covered with the anionized sulfonic acid group and the hydrophobic component. Re-adhesion of the hydrophobic component to the surface of the object to be surface treated is hindered by this.

In addition, with regard to the positively chargeable component, the positively chargeable component is removed from the surface of the object to be surface treated as the surface of the object to be surface treated which is covered with the anionized sulfonic acid group and the positively chargeable component which is covered with the anionized sulfonic acid group electrostatically repel each other under an acidic condition in the same manner as in the case in which the object to be surface treated contains silicon nitride or silicon oxide.

Moreover, the sulfonic acid group-containing polymer adsorbed to the surface of the object to be surface treated is easily removed after the surface treatment step since it exhibits favorable removability.

In this manner, the surface treatment composition according to an embodiment of the present invention functions such that the sulfonic acid group-containing polymer removes both the positively chargeable component and the hydrophobic component under an acidic condition in a case in which the object to be surface treated contains silicon nitride, silicon oxide, or polysilicon. Moreover, as a result, organic residues can be extremely favorably removed.

Incidentally, it is considered that the reason for that the organic residues derived from a composition for polishing and various kinds of pads have not been sufficiently removed by the technique according to JP 2012-74678 A is because the specifically disclosed compound having a sulfonic acid (salt) group is a low molecular weight compound and a low molecular weight compound which has a sulfonic acid (salt) group does not exhibit favorable property to cover the surface of an object to be surface treated and the surface of a positively chargeable component, an adequate electrostatic repulsive force for removing organic residues, favorable removability after the surface treatment step, and the like as a sulfonic acid group-containing polymer does although the details are unknown.

It should be noted that the above mechanisms are based on presumption and the correctness or fault thereof does not affect the technical scope of the present invention.

Hereinafter, the respective components to be contained in the surface treatment composition will be described.

[Polymer Compound Having Sulfonic Acid (Salt) Group]

The surface treatment composition according to an embodiment of the present invention essentially contains a polymer compound having a sulfonic acid (salt) group. The polymer compound having a sulfonic acid (salt) group (also referred to as a sulfonic acid group-containing polymer in the present specification) contributes to the removal of organic residues by the surface treatment composition. Incidentally, in the present specification, the term "sulfonic acid (salt) group" means a "sulfonic acid group" or a "sulfonate group".

The sulfonic acid group-containing polymer is not particularly limited as long as it has a plurality of sulfonic acid (salt) groups, and a known compound can be used. Examples of the sulfonic acid group-containing polymer may include a polymer compound obtained by sulfonating a polymer compound to be the base and a polymer compound obtained by (co)polymerizing a monomer having a sulfonic acid (salt) group.

More specific examples thereof may include sulfonic acid-modified polyvinyl alcohol (also referred to as sulfonic acid group-containing polyvinyl alcohol and sulfonic acid group-containing modified polyvinyl alcohol in the present specification), sulfonic acid group-containing polystyrene such as polystyrene sulfonic acid (also referred to as sulfonic acid group-containing modified polystyrene in the present specification), sulfonic acid-modified polyvinyl acetate (also referred to as sulfonic acid group-containing polyvinyl acetate and sulfonic acid group-containing modified polyvinyl acetate in the present specification), sulfonic acid group-containing polyester (also referred to as sulfonic acid group-containing modified polyester in the present specification), a copolymer of a (meth)acrylic group-containing monomer and a sulfonic acid group-containing monomer such as a copolymer of (meth)acrylic acid-sulfonic acid group-containing monomer, and any derivative thereof. At least a part or all of the sulfonic acid groups belonging to these polymers may be in the form of a salt. Examples of the salt may include alkali metal salts such as a sodium salt and a potassium salt, salts of Group 2 elements such as a calcium salt and a magnesium salt, amine salts, and ammonium salts.

Among these, sulfonic acid-modified polyvinyl alcohol, sulfonic acid group-containing polystyrene, or a copolymer of a (meth)acryl group-containing monomer and a sulfonic acid group-containing monomer or any salt thereof is preferable, sulfonic acid-modified polyvinyl alcohol, polystyrene sulfonic acid, or a copolymer of a (meth)acrylic acid-sulfonic acid group-containing monomer or any salt thereof is more preferable, sulfonic acid-modified polyvinyl alcohol, polystyrene sulfonic acid, or any salt thereof is still more preferable, polystyrene sulfonic acid or any salt thereof is particularly preferable, and p-polystyrene sulfonic acid or any salt thereof is most preferable. In addition, as a salt of these compounds, a sodium salt is particularly preferable.

In addition, in a case in which the sulfonic acid group-containing polymer is sulfonic acid-modified polyvinyl alcohol, the degree saponification is preferably 80% or more and more preferably 85% or more (upper limit: 100%) from the viewpoint of solubility.

In the present invention, the weight average molecular weight of the sulfonic acid group-containing polymer is preferably 1000 or more. The effect of removing organic residues further increases when the weight average molecular weight is 1000 or more. It is presumed that the reason for this is because the covering property when covering the object to be surface treated and the positively chargeable component becomes more favorable and the action of removing organic residues from the surface of the object to be surface treated or the action of suppressing re-adhesion of the organic residues to the surface of the object to be surface treated is further improved. The weight average molecular weight is more preferably 2000 or more, still more preferably 2500 or more, particularly preferably 3000 or more, and most preferably 8000 or more from the same viewpoint.

In addition, the weight average molecular weight of the sulfonic acid group-containing polymer is preferably 100,000 or less. The effect of removing organic residues further increases when the weight average molecular weight is 100,000 or less. It is presumed that the reason for this is because the removability of the sulfonic acid group-containing polymer after the surface treatment step becomes more favorable. The weight average molecular weight is more preferably 50,000 or less and still more preferably 25,000 or less from the same viewpoint.

The weight average molecular weight can be measured by gel permeation chromatography (GPC). Details on the method of measuring the weight average molecular weight will be described in Examples.

As the sulfonic acid group-containing polymer, a commercially available product may be used, and GOHSENX (registered trademark) L-3226 and GOHSENX (registered trademark) CKS-50 manufactured by The Nippon Synthetic Chemical Industry Co., Ltd., ARON (registered trademark) A-6012, A-6016A, and A-6020 manufactured by TOAGOSEI CO., LTD., Poly NaSS (registered trademark) PS-1 manufactured by Tosoh Finechem Corporation, and the like can be used.

Incidentally, the sulfonic acid group-containing polymer may be used singly or in combination of two or more kinds thereof.

The content of the sulfonic acid group-containing polymer is preferably 0.01% by mass or more with respect to the total mass of the surface treatment composition. The effect of removing organic residues is further improved when the content of the sulfonic acid group-containing polymer is 0.01% by mass or more. It is presumed that the reason for this is because a larger area is covered when the sulfonic acid group-containing polymer covers the object to be surface treated and the positively chargeable component. It is also presumed that the reason for this is because the electrostatic adsorption or repulsion effect can be more strongly exerted as the number of sulfonic acid (salt) groups increases. The content of the sulfonic acid group-containing polymer is preferably 0.05% by mass or more and still more preferably 0.09% by mass or more with respect to the total mass of the surface treatment composition from the same viewpoint. In addition, the content of the sulfonic acid group-containing polymer is preferably 10% by mass or less with respect to the total mass of the surface treatment composition. The effect of removing organic residues further increases when the content of the sulfonic acid group-containing polymer is 10% by mass or less. It is presumed that the reason for this is because the removability of the sulfonic acid group-containing polymer after the surface treatment step becomes more favorable. The content of the sulfonic acid group-containing polymer is more preferably 5% by mass or less and still more preferably 1% by mass or less with respect to the total mass of the surface treatment composition from the same viewpoint.

In addition, the content of the sulfonic acid group-containing polymer is preferably more than 80% by mass (upper limit: 100% by mass) with respect to the total mass of the polymer compounds to be contained in the surface treatment composition. The effect of removing organic residues is further improved when the content of the sulfonic acid group-containing polymer is more than 80% by mass with respect to the total mass of the polymer compounds to be contained in the surface treatment composition. The reason for this is because the amount of the polymer compound, which can be a cause of the organic residues after the surface treatment step, other than the sulfonic acid group-containing polymer decreases. It is also presumed that the reason for this is because the hindrance of covering by the polymer compound other than the sulfonic acid group-containing polymer decreases when the sulfonic acid group-containing polymer covers the object to be surface treated and the positively chargeable component. It is further presumed that the reason for this is because the hindrance of the exertion of the electrostatic adsorption effect or repulsion effect by the sulfonic acid group-containing polymer by the polymer compound other than the sulfonic acid group-containing polymer decreases. From the same viewpoint, the content of the sulfonic acid group-containing polymer is more preferably more than 95% by mass with respect to the total mass of the polymer compounds to be contained in the surface treatment composition and the content is still more preferably 100% by mass with respect to the total mass of the polymer compounds to be contained in the surface treatment composition, that is, the polymer compounds to be contained in the surface treatment composition are only the sulfonic acid group-containing polymer. The effect of removing organic residues is remarkably improved particularly in a case in which the content of the sulfonic acid group-containing polymer is more than 95% by mass with respect to the total mass of the polymer compounds to be contained in the surface treatment composition.

Incidentally, examples of the polymer compound other than the sulfonic acid group-containing polymer may include polymer compounds used as other additives to be described later.

[Acid]

It is preferable that the surface treatment composition according to an embodiment of the present invention further contains an acid. Incidentally, in the present specification, the sulfonic acid group-containing polymer is handled as one that is different from the acid as an additive to be described here. The acid is presumed to play a role of positively charging the surface of the object to be surface treated which contains silicon nitride or silicon oxide and the surface of the positively chargeable component and contributes to the removal of organic residues by the surface treatment composition.

As the acid, either an inorganic acid or an organic acid may be used. The inorganic acid is not particularly limited, but examples thereof may include sulfuric acid, nitric acid, boric acid, carbonic acid, hypophosphorous acid, phosphorous acid, and phosphoric acid. The organic acid is not particularly limited, but examples thereof may include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, methanesulfonic acid, ethanesulfonic acid, and isethionic acid.

Among these, the acid is more preferably maleic acid or nitric acid and still more preferably maleic acid from the viewpoint that the effect of positively charging the surface of the object to be surface treated and the surface of the positively chargeable component becomes more favorable.

Incidentally, the acid may be used singly or in combination of two or more kinds thereof.

The content of the acid is preferably 0.05% by mass or more with respect to the total mass of the surface treatment composition. The effect of removing organic residues is further improved when the content of the acid is 0.05% by mass or more. It is presumed that the reason for this is because the effect of positively charging the surface of the object to be surface treated which contains silicon nitride or silicon oxide and the surface of the positively chargeable component becomes more favorable. The content of the acid is preferably 0.1% by mass or more and still more preferably 0.15% by mass or more with respect to the total mass of the surface treatment composition from the same viewpoint. In addition, the content of the acid is preferably 10% by mass or less with respect to the total mass of the surface treatment composition. The damage to the apparatus caused by a low pH can decrease when the content of the acid is 10% by mass or less. The content of the acid is more preferably 5% by mass or less and still more preferably 3% by mass or less with respect to the total mass of the surface treatment composition from the same viewpoint.

However, in order to further improve the effect of removing organic residues, it is preferable that the surface treatment composition according to an embodiment of the present invention does not substantially contain phosphonic acid or a compound having a phosphonic acid group and a molecular weight of less than 1000 as the acid and it is preferable that the surface treatment composition does not substantially contain a salt of these. In other words, it is preferable that the surface treatment composition according to an embodiment of the present invention does not substantially contain phosphonic acid, a compound having a phosphonic acid group and a molecular weight of less than 1000, or a salt thereof. Here, "not to substantially contain phosphonic acid, a compound having a phosphonic acid group and a molecular weight of less than 1000, or a salt thereof" refers to a case in which the content of phosphonic acid, a compound having a phosphonic acid group and a molecular weight of less than 1000, or a salt thereof (the total content in the case of containing a plurality of these) is 0.01% by mass or less with respect to the total mass of the surface treatment composition.

[Abrasive Grain]

The surface treatment composition according to an embodiment of the present invention may contain abrasive grains, but it is preferable that the surface treatment composition according to an embodiment of the present invention does not substantially contain abrasive grains from the viewpoint of further improving the effect of removing defects. Here, "not to substantially contain abrasive grains" refers to a case in which the content of abrasive grains is 0.01% by mass or less with respect to the total mass of the surface treatment composition.

[Other Additives]

The surface treatment composition according to an embodiment of the present invention may contain other additives at arbitrary proportions if necessary within the range in which the effect of the present invention is not inhibited. However, components other than the essential components of the surface treatment composition according to an embodiment of the present invention may be a cause of defects and thus it is desirable not to add the components other than the essential components as possible, the amount of the components other than the essential components added is preferably as small as possible, and it is more preferable not to contain the components other than the essential components. Examples of other additives may include an alkali, an antiseptic agent, a dissolved gas, a reducing agent, an oxidizing agent, and an alkanolamine.

[Dispersing Medium]

The surface treatment composition according to an embodiment of the present invention essentially contains water as a dispersing medium (solvent). The dispersing medium has a function of dispersing or dissolving the respective components. It is more preferable that the dispersing medium is only water. In addition, the dispersing medium may be a mixed solvent of water and an organic solvent for dispersing or dissolving the respective components. In this case, examples of the organic solvent to be used may include acetone, acetonitrile, ethanol, methanol, isopropanol, glycerin, ethylene glycol, and propylene glycol which are miscible with water. In addition, the respective components may be dispersed or dissolved in these organic solvents without being mixed with water and then the organic solvents may be mixed with water. These organic solvents may be used singly or in combination of two or more kinds thereof.

Water is preferably water which contains impurities as little as possible from the viewpoint of inhibiting the contamination of the object to be surface treated and the action of other components. For example, water in which the total content of transition metal ions is 100 ppb or less is preferable. Here, the purity of water can be increased by, for example, removal of impurity ions using an ion exchange resin, removal of foreign substances using a filter, and an operation such as distillation. Specifically, it is preferable to use, for example, deionized water (ion exchanged water), pure water, ultrapure water, and distilled water as water.

[pH Value]

It is essential that the pH value of the surface treatment composition according to an embodiment of the present invention is less than 7. When the pH value is 7 or more, the effect of positively charging the surface of the object to be surface treated or the surface of the chargeable component is not obtained and a sufficient effect of removing organic residues is not obtained. The pH value is more preferably less than 4, still more preferably less than 3, and particularly preferably 2.5 or less from the same viewpoint. In addition, the pH value is preferably 1 or more. It is possible to further decrease the damage to the apparatus caused by a low pH when the pH value is 1 or more.

Incidentally, the pH value of the surface treatment composition can be confirmed by using a pH meter (model number: LAQUA manufactured by HORIBA, Ltd.).

In the case of adjusting the pH value, it is desirable that components other than the essential components of the surface treatment composition according to an embodiment of the present invention are added as little as possible since the components can be a cause of defects. For this reason, it is preferable to adjust the pH value only with the acid which can be arbitrarily contained or the sulfonic acid group-containing polymer. However, the pH value may be adjusted by using other additives such as an alkali which can be arbitrarily added within the range in which the effect of the present invention is not inhibited in a case in which it is difficult to obtain a desired pH value only with these.

<Method of Producing Surface Treatment Composition>

Another embodiment of the present invention is a method of producing the surface treatment composition described above, which includes mixing a polymer compound having a sulfonic acid (salt) group and water. In the method of producing the surface treatment composition according to an embodiment of the present invention, the abrasive grains, other additives, or a dispersing medium other than water described above and the like may be further mixed. The mixing methods of these such as mixing conditions and mixing order are not particularly limited, and a known mixing method can be used.

<Method of Treating Surface>

Still another embodiment of the present invention is a method of treating a surface, in which the surface of an object to be polished which has been polished (an object to be surface treated) is treated using the surface treatment composition described above to decrease the organic residues on the surface of the object to be polished which has been polished. In the present specification, the method of treating a surface refers to a method of decreasing the organic residues on the surface of an object to be surface treated and is a method of conducting cleaning in a broad sense.

According to the method of treating a surface of an embodiment of the present invention, organic residues remaining can be sufficiently removed. In other words, according to still another embodiment of the present invention, there is provided a method of decreasing the organic residues on the surface of an object to be surface treated, which includes treating the surface of an object to be surface treated using the surface treatment composition described above.

The method of treating a surface according to an embodiment of the present invention is carried out by a method in which the surface treatment composition according to the present invention is brought into direct contact with an object to be surface treated.

Examples of the method of treating a surface may mainly include (I) a method by a rinse polishing treatment and (II) a method by a cleaning treatment. In other words, the surface treatment according to an embodiment of the present invention is preferably conducted by a rinse polishing treatment or a cleaning treatment and more preferably by a cleaning treatment. The rinse polishing treatment and the cleaning treatment are carried out in order to remove defects on the surface of an object to be surface treated and thus to obtain a clean surface. Hereinafter, the above (I) and (II) will be described.

(I) Rinse Polishing Treatment

The surface treatment composition according to an embodiment of the present invention is suitably used in the rinse polishing treatment. In other words, the surface treatment composition according to an embodiment of the present invention can be preferably used as a composition for rinse polishing. The rinse polishing treatment is conducted on a polishing table (platen) to which a polishing pad is attached after the final polishing (finish polishing) of an object to be polished is conducted for the purpose of removing the defects on the surface of the object to be polished which has been polished (also referred to as an object to be surface treated and an object to be surface treated by rinse polishing when conducting a rinse polishing treatment as the surface treatment). At this time, the rinse polishing treatment is conducted by bringing the composition for rinse polishing into direct contact with the object to be surface treated by rinse polishing. As a result, the defects on the surface of the object to be surface treated by rinse polishing are removed by the frictional force (physical action) by the polishing pad and the chemical action by the composition for rinse polishing. Among the defects, particularly particles and organic residues are likely to be removed by the physical action. Hence, in the rinse polishing treatment, it is possible to effectively remove particles and organic residues by utilizing friction with the polishing pad on the polishing table (platen).

In other words, in the present specification, the rinse polishing treatment, the rinse polishing method, and the rinse polishing step respectively refer to a treatment, a method, and a step for decreasing the defects on the surface of an object to be surface treated by rinse polishing by using a polishing pad.

Specifically, the rinse polishing treatment can be conducted by placing the surface of an object to be surface treated by rinse polishing after the polishing step on the polishing table (platen) of a polishing apparatus, bringing the polishing pad and the object to be surface treated by rinse polishing into contact with each other, and relatively sliding the object to be surface treated by rinse polishing and the polishing pad while supplying the composition for rinse polishing to the contact portion.

The rinse polishing treatment can be conducted by using either a single side polishing apparatus or a double side polishing apparatus. In addition, it is preferable that the polishing apparatus is equipped with a discharge nozzle for the composition for rinse polishing in addition to the discharge nozzle for the composition for polishing. The operating conditions at the time of the rinse polishing treatment by the polishing apparatus are not particularly limited and can be appropriately set by those skilled in the art.

(II) Cleaning Treatment

The surface treatment composition according to an embodiment of the present invention is suitably used in a cleaning treatment. In other words, the surface treatment composition according to an embodiment of the present invention can be preferably used as a composition for cleaning. The cleaning treatment is conducted after the final polishing (finish polishing) of an object to be polished is conducted or a rinse polishing treatment as the surface treatment or another rinse polishing treatment using a composition for rinse polishing other than the surface treatment composition of the present invention to be described later is conducted for the purpose of removing foreign substances on the surface of the object to be polished which has been polished (also referred to as an object to be surface treated and an object to be cleaned when conducting a cleaning treatment). Incidentally, the cleaning treatment and the rinse polishing treatment as the surface treatment are classified depending on the place at which these treatments are conducted even though these treatments are surface treatments, and the cleaning treatment is a surface treatment to be conducted after the object to be cleaned is detached from the polishing table (platen).

In other words, in the present specification, the cleaning treatment, the cleaning method, and the cleaning step respectively refer to a treatment, a method, and a step for decreasing the defects on the surface of an object to be cleaned without using a polishing pad.

A cleaning method according to an embodiment of the present invention is carried out by a method in which a composition for cleaning according to an embodiment of the present invention is brought into direct contact with an object to be cleaned.

Examples of the method of bringing the composition for cleaning into contact with the object to be cleaned may include a dipping type in which a cleaning tank is filled with the composition for cleaning and the object to be cleaned is immersed in the cleaning tank, a spin type in which the object to be cleaned is rotated at a high speed while allowing the composition for cleaning to flow onto the object to be cleaned through a nozzle, and a spray type in which the object to be cleaned is cleaned by spraying a liquid to the object to be cleaned.

As a general method and a general step for conducting the cleaning treatment, there are known (i) a method and a step in which the object to be cleaned is immersed in the composition for cleaning and subjected to a ultrasonic treatment and (ii) a method and a step in which the cleaning brush and one side or both sides of the object to be cleaned are brought into contact with each other in a state of holding the object to be cleaned and the surface of the object to be cleaned is rubbed with the brush while supplying the composition for cleaning to the contact portion. In such a step, the defects on the surface of the object to be cleaned are removed by the mechanical force to be generated by ultrasonic waves or the frictional force by the cleaning brush and the chemical action by the composition for cleaning.

The method and step of conducting the cleaning treatment according to an embodiment of the present invention are not particularly limited, but they are preferably a method and a step which include a spin type or spray type contact method and still more preferably a method and a step which include a spin type contact method from the viewpoint of being able to more efficiently remove contamination in a shorter time. Among these, the method and step are still more preferably a method and a step which include a spin type contact method using a polishing apparatus and a cleaning brush.

In addition, as an apparatus for conducting such a cleaning treatment, there are a batch type cleaning apparatus by which a plurality of objects to be cleaned housed in a cassette are cleaned at the same time and a single wafer type cleaning apparatus by which one object to be cleaned is mounted on a holder and cleaned. The method of a cleaning treatment using a single wafer type cleaning apparatus as an apparatus for conducting the cleaning treatment is preferable from the viewpoint of shortening the cleaning time and decreasing the amount of cleaning liquid used.

Furthermore, examples of the apparatus for conducting the cleaning treatment may include a polishing apparatus equipped with a facility for cleaning by which the object to be cleaned is detached from the polishing table (platen) and then rubbed with a cleaning brush. It is possible to more efficiently conduct the cleaning treatment of the object to be cleaned by using such a polishing apparatus.

As a polishing apparatus, it is possible to use a general polishing apparatus to which a holder for holding the object to be cleaned and a motor of which the rotation speed can be changed are attached and which has a polishing table to which a cleaning brush can be attached, a cleaning brush, and the like. As the polishing apparatus, either a single side polishing apparatus or a double side polishing apparatus may be used. Specifically, for example, Mirra Mesa manufactured by Applied Materials, Inc. and the like can be preferably used as the polishing apparatus. Incidentally, it is more efficient and preferable to use the same cleaning apparatus as the polishing apparatus used in the CMP step or the polishing apparatus used in the rinsing step in the case of arbitrarily providing a rinsing step.

The cleaning brush is not particularly limited, but it is preferable to use a resin brush. The material of the resin brush is not particularly limited, but it is preferable to use, for example, PVA (polyvinyl alcohol). Moreover, as the cleaning brush, it is particularly preferable to use a PVA sponge.

The cleaning conditions are also not particularly limited and can be appropriately set depending on the kind of the object to be cleaned and the kind and amount of the organic residues to be removed. For example, it is preferable that the rotation speed of the cleaning brush is 10 rpm or more and 200 rpm or less, the rotation speed of the object to be cleaned is 10 rpm or more and 100 rpm or less, and the pressure (polishing pressure) to be applied to the object to be cleaned is 0.5 psi or more and 10 psi or less. The method of supplying the composition for cleaning to the polishing pad is also not particularly limited, and for example, a method (constant flow) in which the composition for cleaning is continuously supplied to the polishing pad by using a pump or the like is adopted. The supply amount of this is not limited, it is preferable that the cleaning brush and the surface of the object to be cleaned are always covered with the composition for cleaning according to an embodiment of the present invention, and the supply amount is preferably 10 mL/min or more and 5000 mL/min or less. The cleaning time is also not particularly limited but it is preferably 5 seconds or more and 180 seconds or less for the step using the composition for cleaning according to an embodiment of the present invention. It is possible to more favorably remove the organic residues when the cleaning time is in such a range.

The temperature of the composition for cleaning at the time of cleaning is not particularly limited, and it may be usually room temperature, but the composition for cleaning may be heated to about 40° C. or more and 70° C. or less in a range in which the performance is not impaired.

Here, the object to be cleaned is preferably one after being subjected to a rinse polishing treatment as the surface treatment or another rinse polishing treatment using a composition for rinse polishing, which will be described later, other than the surface treatment composition of the present invention.

Cleaning with water may be conducted before or after or before and after the surface treatment by the method of treating a surface according to an embodiment of the present invention, for example, the methods of (I) and (II) described above.

In addition, it is preferable that the object to be surface treated after the surface treatment is dried by removing water droplets adhered to the surface by using a spin dryer and the like. In addition, the surface of the object to be surface treated may be dried by air blow drying.

[Effect of Removing Organic Residue]

It is more preferable as the surface treatment composition according to an embodiment of the present invention has a higher effect of removing the organic residues on the surface of an object to be surface treated. In other words, it is more preferable as the number of organic residues remaining on the surface is smaller after the surface treatment of organic residues is conducted by using the surface treatment composition. Specifically, the number of organic residues after the object to be surface treated is subjected to a surface treatment using a surface treatment composition (after cleaning or drying in the case of conducting cleaning with water or drying thereafter) is preferably 260 or less, more preferably 150 or less, still more preferably 80 or less, yet more preferably 25 or less, particularly preferably 15 or less, and most preferably 12 or less (lower limit: 0).

<Method of Producing Semiconductor Substrate>

Yet another embodiment of the present invention is a method of producing a semiconductor substrate, in which the object to be polished which has been polished (object to be surface treated) is a polished semiconductor substrate and which includes a surface treatment step of decreasing organic residues on the surface of the polished semiconductor substrate by the method of treating a surface according to an embodiment of the present invention.

Details on the semiconductor substrate to which the production method of the present invention is applied are described in the description on the object to be polished which has been polished and is subjected to a surface treatment using the surface treatment composition according to an embodiment of the present invention.

The production method according to an embodiment of the present invention is not particularly limited as long as it includes a surface treatment step of decreasing organic residues on the surface of a polished semiconductor substrate, but examples thereof may include a method including a polishing step for forming a polished semiconductor substrate and a step (a cleaning step) of conducting the cleaning treatment described above. In addition, another example thereof may include a method including a step (rinse polishing step) of conducting rinse polishing as the surface treatment for decreasing the defects on the surface of the polished semiconductor substrate between the polishing step and the cleaning step in addition to the polishing step and the cleaning step.

[Polishing Step]

The polishing step which can be included in the method of producing a semiconductor substrate according to an embodiment of the present invention is a step of polishing a semiconductor substrate containing silicon nitride, silicon oxide, or polysilicon to form a polished semiconductor substrate (object to be surface treated).

The polishing step is not particularly limited as long as it is a step of polishing a semiconductor substrate, but it is preferably a chemical mechanical polishing (CMP) step. In addition, the polishing step may be a polishing step consisting of a single step or a polishing step consisting of a plurality of steps. Examples of the polishing step consisting of a plurality of steps may include a step of conducting a finish polishing step after a preliminary polishing step (rough polishing step) and a step of conducting a primary polishing step, then a secondary polishing step one time or two or more times, and then a finish polishing step.

As the composition for polishing, a known composition for polishing can be appropriately used depending on the properties of the semiconductor substrate. The composition for polishing is not particularly limited, but for example, it is possible to preferably use one that contains abrasive grains, an acid salt, a dispersing medium, and an acid and the like. Specific examples of such a composition for polishing may include a composition for polishing which contains sulfonic acid-modified colloidal silica, ammonium sulfate, water, and maleic acid.

As a polishing apparatus, it is possible to use a general polishing apparatus to which a holder for holding the object to be polished and a motor of which the rotation speed can be changed are attached and which has a polishing table to which a polishing pad (polishing cloth) can be attached. As the polishing apparatus, either a single side polishing apparatus or a double side polishing apparatus may be used. Specifically, for example, Mirra Mesa manufactured by Applied Materials, Inc. and the like can be preferably used as the polishing apparatus.

As the polishing pad, a general nonwoven fabric, polyurethane, a porous fluororesin, and the like can be used without particular limitation. It is preferable that the polishing pad is subjected to groove processing so that the polishing liquid is accumulated therein. It is preferable that the polishing pad is subjected to groove processing so that the composition for polishing is accumulated therein. Specifically, for example, rigid polyurethane pad IC 1000 manufactured by Nitta Haas Incorporated can be preferably used as the polishing pad.

The polishing conditions are also not particularly limited, and for example, the rotation speed of the polishing table and the rotation speed of the head (carrier) are preferably 10 rpm or more and 100 rpm or less and the pressure (polishing pressure) to be applied to the object to be polished is preferably 0.5 psi or more and 10 psi or less. The method of supplying the composition for polishing to the polishing pad is also not particularly limited, and for example, a method (constant flow) in which the composition for polishing is continuously supplied to the polishing pad by using a pump or the like is adopted. The supply amount of this is not limited, it is preferable that the surface of the polishing pad is always covered with the composition for polishing, and the supply amount is preferably 10 mL/min or more and 5000 mL/min or less. The polishing time is also not particularly limited but it is preferably 5 seconds or more and 180 seconds or less for the step using the composition for polishing.

[Another Rinse Polishing Step]

The method of producing a semiconductor substrate according to an embodiment of the present invention may include a step (it is also simply referred to as "another rinse polishing step" in the present specification) of conducting a rinse polishing treatment using a composition for rinse polishing other than the surface treatment composition according to the present invention. It is preferable to provide another rinse polishing step between the polishing step and the surface treatment step in the method of producing a semiconductor substrate according to an embodiment of the present invention. Another rinse polishing step is a step of placing the surface of the semiconductor substrate containing silicon nitride, silicon oxide, or polysilicon after the polishing step on the polishing table (platen) of a polishing apparatus, bringing the polishing pad and the polished semiconductor substrate into contact with each other, and relatively sliding the polished semiconductor substrate and the polishing pad while supplying the composition for rinse polishing other than the surface treatment composition according to the present invention to the contact portion. As a result, the defects on the surface of the object to be polished which has been polished are removed by the frictional force by the polishing pad and the chemical action by the composition for rinse polishing.

As the composition for rinse polishing other than the surface treatment composition according to the present invention, it is possible to appropriately use a known composition for rinse polishing depending on the kind of polished semiconductor substrate and the kind and amount of defects to be removed. The composition for rinse polishing other than the surface treatment composition according to the present invention is not particularly limited, but for example, those containing a water-soluble polymer, a dispersing medium, and an acid can be preferably used. Specific examples of the composition for rinsing polishing may include a composition for rinse polishing which contains polyvinyl alcohol, water, and nitric acid.

In another rinse polishing step, with regard to the apparatuses such as the polishing apparatus and the polishing pad and the polishing conditions, the same apparatuses and conditions as those in the polishing step described above can be applied except that a composition for rinse polishing other than the surface treatment composition according to the present invention is supplied instead of the composition for polishing.

[Surface Treatment Step]

The surface treatment step is a step of decreasing the organic residues on the surface of a polished semiconductor substrate by the method of treating a surface according to an embodiment of the present invention.

Here, preferred examples of the surface treatment step may include a step (a rinse polishing step) of conducting a rinse treatment as the surface treatment and a step (a cleaning step) of conducting the cleaning treatment.

Details on the method of treating a surface to be used in these surface treatment steps are the same as those described in the description on the method of treating a surface according to an embodiment of the present invention described above.

EXAMPLES

The present invention will be described in more detail with reference to the following Examples and Comparative Examples, but the technical scope of the present invention is not limited to only the following Examples. Incidentally, "%" and "parts" respectively mean "% by mass" and "parts by mass" unless otherwise stated.

<Preparation of Surface Treatment Composition (Composition for Cleaning)>

[Preparation of Composition for Cleaning A-1]

A composition for cleaning A-1 was prepared by mixing 0.5 parts by mass of an aqueous solution of maleic acid having a concentration of 30% by mass as an organic acid, 0.1 parts by mass of sulfonic acid-modified polyvinyl alcohol (PVA) (salt: sodium salt, weight average molecular weight: 9,000) (GOHSENX (registered trademark) L-3226 manufactured by The Nippon Synthetic Chemical Industry Co., Ltd.), and 99.8 parts by mass of water (deionized water). The pH value of the composition for cleaning A-1 (liquid temperature: 25° C.) was confirmed by using a pH meter (model number: LAQUA manufactured by HORIBA, Ltd.), and as a result, the pH value was 2.

[Preparation of Compositions for Cleaning A-2 to A-5 and C-1 to C-10]

The respective compositions for cleaning were prepared by the same operation as in the preparation of the composition for cleaning A-1 except that the sulfonic acid-modified PVA was changed to the respective kinds of additives to be presented in the following Tables 1 to 3. Incidentally, "-" in the table indicates that the corresponding component was not used. In addition, the pH values of the respective compositions for cleaning are also presented in the following Tables 1 to 3.

The product names of the additives in the table other than the additives used in the composition for cleaning A-1 are presented below.

Used in A-2: Sulfonic acid-modified PVA (salt: sodium salt, weight average molecular weight: 10,000) (GOHSENX (registered trademark) CKS-50 manufactured by The Nippon Synthetic Chemical Industry Co., Ltd.)

Used in C-1: Acetoacetyl-modified PVA (GOHSENX (registered trademark) Z100 manufactured by The Nippon Synthetic Chemical Industry Co., Ltd.)

Used in C-2: Polyacrylate (DISPERBYK (registered trademark)-194N manufactured by BYK)

Used in C-3: Carboxylic acid-modified PVA (GOHSENX (registered trademark) T330 manufactured by The Nippon Synthetic Chemical Industry Co., Ltd.)

Used in C-4: Ethylene oxide-modified PVA (GOHSENX (registered trademark) WO320N manufactured by The Nippon Synthetic Chemical Industry Co., Ltd.)

Used in C-5: Modified PVA having quaternary ammonium salt in side chain (GOHSENX (registered trademark) K-434 manufactured by The Nippon Synthetic Chemical Industry Co., Ltd.)

Used in C-6: Sodium polyacrylate (ARON (registered trademark) A-210 manufactured by TOAGOSEI CO., LTD.)

Used in C-7: Polyacrylic acid ammonium salt (ARON (registered trademark) A-30SL manufactured by TOAGOSEI CO., LTD)

Used in A-3: Copolymer of acrylic acid-sulfonic acid group-containing monomer (salt: sodium salt, weight average molecular weight: 10,000) (ARON (registered trademark) A-6020 manufactured by TOAGOSEI CO., LTD.)

Used in A-4: Copolymer of acrylic acid-sulfonic acid group-containing monomer (salt: sodium salt, weight average molecular weight: 2,000) (ARON (registered trademark) A-6016A manufactured by TOAGOSEI CO., LTD.)

Used in C-8: Phosphoric acid ester (DISPERBYK (registered trademark)-180 manufactured by BYK)

Used in C-9: Acrylate copolymer (DISPERBYK (registered trademark)-2015 manufactured by BYK)

Used in A-5: Sodium polystyrene sulfonate (Poly NaSS (registered trademark) PS-1 manufactured by Tosoh Finechem Corporation)

Used in C-10: Sodium dodecylbenzenesulfonate (sodium dodecylbenzenesulfonate manufactured by Tokyo Chemical Industry Co., Ltd.)

[Measurement of Weight Average Molecular Weight]

Incidentally, the values of the weight average molecular weights (in terms of polyethylene glycol) measured by gel permeation chromatography (GPC) were used as the weight average molecular weights of the additives other than a phosphoric acid ester. The weight average molecular weight was measured by using the following apparatus under the following conditions.

GPC apparatus: manufactured by SHIMADZU CORPORATION

Model: Prominence+ELSD detector (ELSD-LTII)

Column: VP-ODS (manufactured by SHIMADZU CORPORATION)

Mobile phase A: MeOH

B: 1% aqueous solution of acetic acid

Flow rate: 1 mL/min

Detector: ELSD temp. 40° C., Gain 8, $N_2$ GAS 350 kPa

Oven temperature: 40° C.

Injection volume: 40 μL.

<Preparation of Object to be Polished which has been Polished (Object to be Surface Treated, Object to be Cleaned)>

A polished silicon nitride substrate, a polished TEOS substrate, and a polished polysilicon substrate obtained by further treating a polished silicon nitride substrate, a polished TEOS substrate, and a polished polysilicon substrate after being polished by the following chemical mechanical polishing (CMP) step by the following another rinsing step were prepared as objects to be polished which had been polished, respectively.

[CMP Step]

A silicon nitride substrate, a TEOS substrate, and a polysilicon substrate which were semiconductor substrates were polished using a composition for polishing M (composition: 4% by mass of sulfonic acid-modified colloidal silica (prepared by the method described in "sulfonic acid-functionalized silica through quantitative oxidation of thiol groups", Chem. Commun. 246-247 (2003), primary particle size: 30 nm, secondary particle size: 60 nm), 1% by mass of ammonium sulfate, 0.018% by mass of an aqueous solution of maleic acid having a concentration of 30% by mass, solvent:water) under the following conditions, respectively. Here, a 200 mm wafer was used as the silicon nitride substrate, the TEOS substrate, and the polysilicon substrate.

(Polishing Apparatus and Polishing Conditions)

Polishing apparatus: Mirra Mesa manufactured by Applied Materials, Inc.

Polishing pad: Rigid polyurethane pad IC 1010 manufactured by Nitta Haas Incorporated Polishing pressure: 2.0 psi (1 psi=6894.76 Pa, the same applies hereinafter)

Rotation speed of polishing table: 60 rpm

Rotation speed of head: 60 rpm

Supply of composition for polishing: constant flow

Supply amount of composition for polishing: 100 mL/min

Polishing time: 60 seconds.

[Another Rinse Polishing Step]

The polished silicon nitride substrate, polished TEOS substrate, and polished polysilicon substrate after being polished by the CMP step if necessary were subjected to rinse polishing using a composition for rinse polishing R (composition: 0.1% by weight of polyvinyl alcohol (weight average molecular weight: 10,000), solvent: water, adjusted to pH=2 with nitric acid) other than the surface treatment composition according to the present invention under the following conditions, respectively.

(Polishing Apparatus for Rinse and Rinse Conditions)

Polishing apparatus: Mirra Mesa manufactured by Applied Materials, Inc.

Polishing pad: Rigid polyurethane pad IC 1010 manufactured by Nitta Haas Incorporated Polishing pressure: 1.0 psi Rotation speed of polishing table: 60 rpm Rotation speed of head: 60 rpm Supply of composition for polishing: constant flow Supply amount of composition for polishing: 100 mL/min Polishing time: 60 seconds.

<Cleaning Step>

The respective objects to be polished which had been polished were cleaned using the respective compositions for cleaning thus prepared or water (deionized water) by a method of a cleaning treatment in which the respective objects to be polished which had been polished were rubbed with a polyvinyl alcohol (PVA) sponge, which was a cleaning brush, while applying a pressure to the objects under the following conditions.

(Cleaning Apparatus and Cleaning Conditions)

Apparatus: Mirra Mesa manufactured by Applied Materials, Inc.

Rotation speed of cleaning brush: 100 rpm

Rotation speed of object to be cleaned (object to be polished which had been polished): 50 rpm Flow rate of cleaning liquid: 1000 mL/min Cleaning time: 60 seconds.

<Evaluation>

The respective objects to be polished which had been polished and then cleaned in the cleaning step described above were subjected to the measurement of the following items and the evaluation. The evaluation results are presented in Table 1 altogether.

[Evaluation on Number of Defects]

The number of defects of 0.10 μm or more after the objects to be polished which had been polished were cleaned using the respective compositions for cleaning under the cleaning conditions described above was measured. For the measurement of the number of defects, SP-2 manufactured by KLA-Tencor Corporation was used. The measurement was conducted for the part remained after excluding the part having a width of 5 mm from the outer peripheral end portion of one side of the object to be polished which had been polished.

[Evaluation on Number of Organic Residues]

The number of organic residues after the objects to be polished which had been polished were cleaned using the respective compositions for cleaning under the cleaning conditions described above was measured through SEM observation using a Review SEM RS 6000 manufactured by Hitachi, Ltd. First, 100 defects existing in the part remained after excluding the part having a width of 5 mm from the outer peripheral end portion of one side of the object to be polished which had been polished were sampled through SEM observation. Subsequently, the organic residues were visually distinguished among the 100 defects sampled through SEM observation and the number was confirmed, thereby calculating the proportion (%) of the organic residues among the defects. Thereafter, the product of the number of defects (pieces) of 0.10 μm or more, which was measured by using SP-2 manufactured by KLA-Tencor Corporation in the evaluation on the number of defects described above and the proportion (%) of the organic residues among the defects calculated from the SEM observation result was calculated as the number of organic residues (pieces).

With regard to the respective compositions for cleaning, the kinds of additives used in preparation, ionicity, the weight average molecular weight, and the pH value, the presence or absence of rinsing step, and the evaluation results are presented in Table 1 in the case of using a polished silicon nitride substrate, Table 2 in the case of using a polished TEOS substrate, and Table 3 in the case of using a polished polysilicon substrate as an object to be polished which has been polished, respectively.

TABLE 1

(Cleaning of polished silicon nitride substrate)

| | | Composition for cleaning | | | | | | |
|---|---|---|---|---|---|---|---|---|
| | | | | Additives | | | | |
| | Rinsing step | Kind | pH value | Kind | Ionicity | Weight average molecular weight | Number of defects (pieces) | Number of organic residues (pieces) |
| Comparative Example 1 | Absence | Deionized water | — | — | — | — | 271593 | 122217 |
| Comparative Example 2 | Presence | Deionized water | — | — | — | — | 2690 | 1345 |
| Example 1 | Absence | A-1 | 2 | Sulfonic acid-modified PVA (sodium salt) | Anionic | 9000 | 1267 | 13 |
| Example 2 | Absence | A-2 | 2 | Sulfonic acid-modified PVA (sodium salt) | Anionic | 10000 | 1194 | 24 |
| Comparative Example 3 | Absence | C-1 | 2 | Acetoacetyl-modified PVA | Nonionic | 10000 | 44355 | 15081 |
| Comparative Example 4 | Absence | C-2 | 2 | Polyacrylate | — | Nonmeasured | 16505 | 10233 |
| Comparative Example 5 | Absence | C-3 | 2 | Carboxylic acid-modified PVA | Anionic | 10000 | 26242 | 18369 |
| Comparative Example 6 | Absence | C-4 | 2 | Ethylene oxide-modified PVA | Nonionic | 10000 | 32808 | 14764 |
| Comparative Example 7 | Absence | C-5 | 2 | Modified PVA having quaternary ammonium salt in side chain | Cationic | 9000 | 12040 | 8428 |
| Comparative Example 8 | Absence | C-6 | 2 | Sodium polyacrylate | Anionic | 2000 | 262779 | 47300 |
| Comparative Example 9 | Absence | C-7 | 2 | Polyacrylic acid ammonium salt | Anionic | 6000 | 249321 | 54851 |
| Example 3 | Absence | A-3 | 2 | Copolymer of acrylic acid-sulfonic acid group-containing monomer (sodium salt) | Anionic | 10000 | 502 | 26 |

TABLE 1-continued

| (Cleaning of polished silicon nitride substrate) | | | | | | | | |
|---|---|---|---|---|---|---|---|---|
| | | Composition for cleaning | | | | | | |
| | | | | Additives | | | | |
| | Rinsing step | Kind | pH value | Kind | Ionicity | Weight average molecular weight | Number of defects (pieces) | Number of organic residues (pieces) |
| Example 4 | Absence | A-4 | 2 | Copolymer of acrylic acid-sulfonic acid group-containing monomer (sodium salt) | | Anionic | 4980 | 149 |
| Comparative Example 10 | Absence | C-8 | 2 | Phosphoric acid ester | — | Nonmeasured | 425782 | 136250 |
| Comparative Example 11 | Absence | C-9 | 2 | Acrylate copolymer | — | Nonmeasured | 293702 | 44055 |
| Example 5 | Absence | A-5 | 2 | Sodium polystyrene sulfonate | Anionic | 20000 | 1233 | 12 |
| Comparative Example 12 | Absence | C-10 | 2 | Sodium dodecylbenzenesulfonate | Anionic | (348) (Note 1) | 3502 | 469 |

(Note 1) The molecular weight in the parentheses is the molecular weight calculated from the sum of the atomic weights

TABLE 2

| (Cleaning of polished TEOS substrate) | | | | | | | | |
|---|---|---|---|---|---|---|---|---|
| | | Composition for cleaning | | | | | | |
| | | | | Additives | | | Evaluation | |
| | Rinsing step | Kind | pH value | Kind | Ionicity | Weight average molecular weight | Number of defects (pieces) | Number of organic residues (pieces) |
| Comparative Example 101 | Presence | Deionized water | — | — | — | — | 3179 | 520 |
| Example 101 | Absence | A-1 | 2 | Sulfonic acid-modified PVA (sodium salt) | Anionic | 9000 | 1378 | 125 |
| Example 102 | Absence | A-2 | 2 | Sulfonic acid-modified PVA (sodium salt) | Anionic | 10000 | 552 | 201 |
| Example 103 | Absence | A-5 | 2 | Sodium polystyrene sulfonate | Anionic | 20000 | 2342 | 76 |

TABLE 3

| (Cleaning of polished polysilicon substrate) | | | | | | | | |
|---|---|---|---|---|---|---|---|---|
| | | Composition for cleaning | | | | | | |
| | | | | Additives | | | Evaluation | |
| | Rinsing step | Kind | pH value | Kind | Ionicity | Weight average molecular weight | Number of defects (pieces) | Number of organic residues (pieces) |
| Comparative Example 201 | Presence | Deionized water | — | — | — | — | 2875 | 1290 |
| Example 201 | Absence | A-1 | 2 | Sulfonic acid-modified PVA (sodium salt) | Anionic | 9000 | 568 | 540 |
| Example 202 | Absence | A-2 | 2 | Sulfonic acid-modified PVA (sodium salt) | Anionic | 10000 | 221 | 201 |

TABLE 3-continued

| (Cleaning of polished polysilicon substrate) | | | | | | | | |
|---|---|---|---|---|---|---|---|---|
| | | Composition for cleaning | | | | | | |
| | | | | Additives | | | Evaluation | |
| | Rinsing step | Kind | pH value | Kind | Ionicity | Weight average molecular weight | Number of defects (pieces) | Number of organic residues (pieces) |
| Example 203 | Absence | A-4 | 2 | Copolymer of acrylic acid-sulfonic acid group-containing monomer (sodium salt) | Anionic | 2000 | 393 | 254 |

As presented in Table 1, it has been confirmed that the composition for cleaning according to an embodiment of the present invention exhibits a remarkable effect of decreasing the organic residues on the surface of an object to be polished which contains silicon nitride and has been polished by comparison between Examples 1 to 5 and Comparative Example 1.

In addition, as presented in Table 1, it has been confirmed that a remarkable effect of decreasing the organic residues according to the present invention is not obtained in the case of using an additive other than a sulfonic acid group-containing polymer by comparison between Examples 1 to 5 and Comparative Examples 3 to 12.

Furthermore, as presented in Tables 1 to 3, it has been confirmed that the effect of decreasing the organic residues on the surface of an object to be polished which has been polished by the composition for cleaning according to an embodiment of the present invention is greatly superior to the effect of decreasing the organic residues by another rinse polishing step (known rinse polishing step) as well as to the effect of decreasing the organic residues in the case of using deionized water by comparison between Examples 1 to 5 and Comparative Example 2, comparison between Examples 101 to 103 and Comparative Example 101, and comparison between Examples 201 to 203 and Comparative Example 201.

From these results, it is possible to provide a semiconductor substrate in which the organic residues are sufficiently decreased by adopting the cleaning step according to an embodiment of the present invention, for example, even in the case of adopting a method which is not provided with another rinse polishing step (known rinse polishing step) as a method of producing a semiconductor substrate, and it is thus possible to further improve the production efficiency. In addition, it is possible to adopt a method which focuses on the removal of substances other than organic residues as another rinse polishing step, for example, even in the case of adopting a method which is provided with another rinse polishing step as a method of producing a semiconductor substrate, and it is thus possible to increase the degree of freedom when designing a production method which is intended to further decrease the defects of a semiconductor substrate completed.

Incidentally, the surface treatment composition according to an embodiment of the present invention exhibits an excellent effect of decreasing organic residues as a composition for rinse polishing even in the case of conducting a rinse polishing treatment.

This application is based on Japanese Patent Application No. 2016-067151 filed on Mar. 30, 2016, the entire contents of which are incorporated herein by reference.

The invention claimed is:

1. A surface treatment composition comprising a polymer compound having a sulfonic acid (salt) group and water, wherein the surface treatment composition has a pH value of less than 7 and the surface treatment composition is used for decreasing an organic residue on a surface of an object to be polished which contains silicon nitride, silicon oxide, or polysilicon and has been polished, and the polymer compound is at least one selected from the group consisting of sulfonic acid-modified polyvinyl alcohol, sulfonic acid-modified polyvinyl acetate, sulfonic acid group-containing polyester, and a salt thereof.

2. The surface treatment composition according to claim 1, wherein the surface treatment composition has a pH value of 1 or more and less than 3.

3. The surface treatment composition according to claim 1, further comprising an acid.

4. The surface treatment composition according to claim 3, wherein the acid is at least one selected from the group consisting of maleic acid and nitric acid.

5. The surface treatment composition according to claim 1, wherein a content of the polymer compound having a sulfonic acid (salt) group is more than 80% by mass with respect to a total mass of polymer compounds contained in the surface treatment composition.

6. The surface treatment composition according to claim 5, wherein a content of the polymer compound having a sulfonic acid (salt) group is more than 95% by mass with respect to a total mass of polymer compounds contained in the surface treatment composition.

7. The surface treatment composition according to claim 1, wherein the object to be polished which has been polished is an object to be polished which contains silicon nitride and has been polished.

8. A method of treating a surface, the method comprising treating a surface of an object to be polished which has been polished using the surface treatment composition according to claim 1 to decrease an organic residue on the surface of the object to be polished which has been polished.

9. The method of treating a surface according to claim 8, wherein the surface treatment is conducted by a rinse polishing treatment or a cleaning treatment.

10. A method of producing a semiconductor substrate, the method comprising a surface treatment step of decreasing an organic residue on a surface of a polished semiconductor substrate by the method of treating a surface according to claim 8, wherein an object to be polished which has been polished is a polished semiconductor substrate.

11. The surface treatment composition according to claim 1, wherein the weight average molecular weight of the polymer compound is 8000 or more.

12. The surface treatment composition according to claim 1, wherein the weight average molecular weight of the polymer compound is 100000 or less.

13. The surface treatment composition according to claim 1, wherein the surface treatment composition does not substantially contain abrasive grains.

14. A method of producing a surface treatment composition, the method comprising mixing the polymer compound having a sulfonic acid (salt) group and the water, wherein the surface treatment composition has a pH value of less than 7 and the surface treatment composition is used for decreasing an organic residue on a surface of an object to be polished which contains silicon nitride, silicon oxide, or polysilicon and has been polished, and the polymer compound is at least one selected from the group consisting of sulfonic acid-modified polyvinyl alcohol, sulfonic acid-modified polyvinyl acetate, sulfonic acid group-containing polyester, and a salt thereof.

15. A method of treating a surface, the method comprising treating a surface of an object to be polished which contains silicon nitride and has been polished using a surface treatment composition to decrease an organic residue on the surface of the object to be polished which contains silicon nitride and has been polished, wherein, the surface treatment composition comprises a polymer compound having a sulfonic acid (salt) group and water, and the surface treatment composition has a pH value of less than 7, and the weight average molecular weight of the polymer compound is 8000 or more.

16. The method of treating a surface according to claim 15, wherein the weight average molecular weight of the polymer compound is 100000 or less.

17. The method of treating a surface according to claim 15, wherein the surface treatment composition does not substantially contain abrasive grains.

18. The surface treatment composition according to claim 15, wherein the surface treatment composition further comprises an acid, and the acid is at least one selected from the group consisting of maleic acid and nitric acid.

19. The method of treating a surface according to claim 15, wherein the surface treatment is conducted by a rinse polishing treatment or a cleaning treatment.

20. A method of producing a semiconductor substrate, the method comprising a surface treatment step of decreasing an organic residue on a surface of a polished semiconductor substrate by the method of treating a surface according to claim 15, wherein an object to be polished which has been polished is a polished semiconductor substrate.

* * * * *